(12) United States Patent
Lee

(10) Patent No.: US 11,489,138 B2
(45) Date of Patent: Nov. 1, 2022

(54) DISPLAY DEVICE

(71) Applicant: Samsung Display Co., Ltd., Yongin-Si (KR)

(72) Inventor: Dae Geun Lee, Hwaseong-si (KR)

(73) Assignee: Samsung Display Co., Ltd.

( * ) Notice: Subject to any disclaimer, the term of this patent is extended or adjusted under 35 U.S.C. 154(b) by 170 days.

(21) Appl. No.: 16/951,969

(22) Filed: Nov. 18, 2020

(65) Prior Publication Data

US 2021/0074948 A1 Mar. 11, 2021

Related U.S. Application Data

(63) Continuation of application No. 16/384,834, filed on Apr. 15, 2019, now Pat. No. 10,847,746.

(30) Foreign Application Priority Data

Apr. 26, 2018 (KR) .................. 10-2018-0048522

(51) Int. Cl.
*H01L 51/52* (2006.01)
*H01L 23/00* (2006.01)
(Continued)

(52) U.S. Cl.
CPC .......... *H01L 51/5246* (2013.01); *H01L 24/81* (2013.01); *H01L 27/3276* (2013.01); *H01L 51/0097* (2013.01); *H01L 51/5253* (2013.01); H01L 2224/81205 (2013.01); H01L 2251/5338 (2013.01)

(58) Field of Classification Search
CPC ....... H01L 2224/81205; H01L 51/0097; H01L 51/5253; H01L 51/5246; H01L 2251/5338; H01L 27/3244–3293
See application file for complete search history.

(56) References Cited

U.S. PATENT DOCUMENTS 6,265,770 B1 * 7/2001 Uchiyama ............... H01L 24/29
257/778
8,400,438 B2 * 3/2013 Lee ..................... G02F 1/13452
349/149
(Continued)

FOREIGN PATENT DOCUMENTS

KR 10-1010021 B1 1/2011
KR 1010021 B1 * 1/2011
(Continued)

*Primary Examiner* — Errol V Fernandes
*Assistant Examiner* — Jeremy J Joy
(74) *Attorney, Agent, or Firm* — Innovation Counsel LLP

(57) ABSTRACT

A display device includes a base layer including a first portion and a second portion disposed around the second portion; a display unit disposed on a first surface of the first portion and including a light emitting element; a driving circuit disposed on a first surface of the second portion and including a driving chip; a support member attached to a second surface of the first portion and a second surface of the second portion; and an adhesive member disposed between the base layer and the support member, wherein the adhesive member includes a first adhesive member having a first elastic modulus and a second adhesive member having a second elastic modulus that is higher than the first elastic modulus, and the second adhesive member overlaps the driving circuit.

20 Claims, 15 Drawing Sheets

110 : 110A, 110B
500 : 500A, 500B

(51) Int. Cl.
*H01L 27/32* (2006.01)
*H01L 51/00* (2006.01)

(56) References Cited

U.S. PATENT DOCUMENTS

| | | | |
|---|---|---|---|
| 9,591,754 B2 | 3/2017 | Lee | |
| 9,922,909 B2* | 3/2018 | Kim | H01L 27/3276 |
| 10,170,505 B2* | 1/2019 | Lee | H01L 27/1262 |
| 10,367,173 B1* | 7/2019 | Wu | H01L 33/58 |
| 2003/0174273 A1* | 9/2003 | Matsui | H01L 24/83 |
| | | | 349/151 |
| 2010/0182287 A1* | 7/2010 | Lee | G02F 1/13452 |
| | | | 445/24 |
| 2011/0050657 A1* | 3/2011 | Yamada | H01L 27/3293 |
| | | | 361/679.01 |
| 2011/0182046 A1* | 7/2011 | Shiota | H05K 3/361 |
| | | | 361/783 |
| 2014/0118902 A1* | 5/2014 | Kim | G02F 1/133308 |
| | | | 361/679.01 |
| 2014/0306941 A1* | 10/2014 | Kim | G06F 1/1652 |
| | | | 345/204 |
| 2015/0208537 A1* | 7/2015 | Cho | B32B 37/02 |
| | | | 216/24 |
| 2016/0172346 A1* | 6/2016 | Koresawa | H01L 23/293 |
| | | | 257/99 |
| 2016/0197300 A1* | 7/2016 | Hwang | H01L 24/75 |
| | | | 438/26 |
| 2017/0125726 A1* | 5/2017 | Hwang | H01L 51/5246 |
| 2017/0293194 A1* | 10/2017 | Hou | G02F 1/167 |
| 2017/0352834 A1* | 12/2017 | Kim | H01L 27/3276 |
| 2018/0047938 A1* | 2/2018 | Kishimoto | H01L 27/323 |
| 2018/0068931 A1* | 3/2018 | Ha | H01L 24/05 |
| 2019/0181111 A1* | 6/2019 | Kim | H01L 24/14 |
| 2019/0305234 A1* | 10/2019 | Jung | H01L 51/5237 |

FOREIGN PATENT DOCUMENTS

| | | |
|---|---|---|
| KR | 10-1253802 B1 | 4/2013 |
| KR | 10-2014-0052732 A | 5/2014 |
| KR | 10-2017-0072526 A | 6/2017 |

* cited by examiner

DISPLAY DEVICE

This application is a continuation application of U.S. patent application Ser. No. 16/384,834 filed Apr. 15, 2019, which claims priority from Korean Patent Application No. 10-2018-0048522, filed on Apr. 26, 2018, in the Korean Intellectual Property Office, the disclosures of which are incorporated herein by reference in their entirety.

BACKGROUND

1. Field of the Invention

The present disclosure relates to a display device.

2. Description of the Related Art

A display device is a device for visually displaying data. Such a display device includes a substrate partitioned into a display area and a non-display area. In the display area, a display unit is disposed on the substrate, and in the non-display area, a pad and the like are disposed on the substrate. A driving circuit or the like is mounted on the pad to transmit a driving signal to the display unit.

Recently, a slim display device having a flexible substrate, techniques and designs of reducing the area of a visually-recognized non-display area by bending at least a part of a display device, and the like have been researched and developed.

SUMMARY

Accordingly, an aspect of the present disclosure is to provide a display device in which the area of a non-display area is reduced.

Another aspect of the present disclosure is to provide a display device having improved reliability.

According to an embodiment of a display device includes a flexible base layer including a first portion and a second portion disposed around the second portion; a display unit disposed on a first surface of the first portion and including a light emitting element; a driving circuit disposed on a first surface of the second portion and including a driving chip; a support member attached to a second surface of the first portion and a second surface of the second portion; and an adhesive member disposed between the flexible base layer and the support member, wherein the adhesive member includes a first adhesive member having a first elastic modulus and a second adhesive member having a second elastic modulus that is higher than the first elastic modulus, and the second adhesive member overlaps the driving circuit.

According to another embodiment of a display device includes a flexible base layer including a first portion, a second portion disposed around the first portion, and a bending portion disposed between the first portion and the second portion; a display unit disposed on a first surface of the first portion and including a light emitting element; a driving circuit disposed on a first surface of the second portion and including a driving chip; a support member disposed on a second surface of the first portion and a second surface of the second portion; and an adhesive member disposed between the flexible base layer and the support member wherein the adhesive member includes a first adhesive member having a first elastic modulus and a second adhesive member having a second elastic modulus that is higher than the first elastic modulus, and the second adhesive member overlaps the driving circuit.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
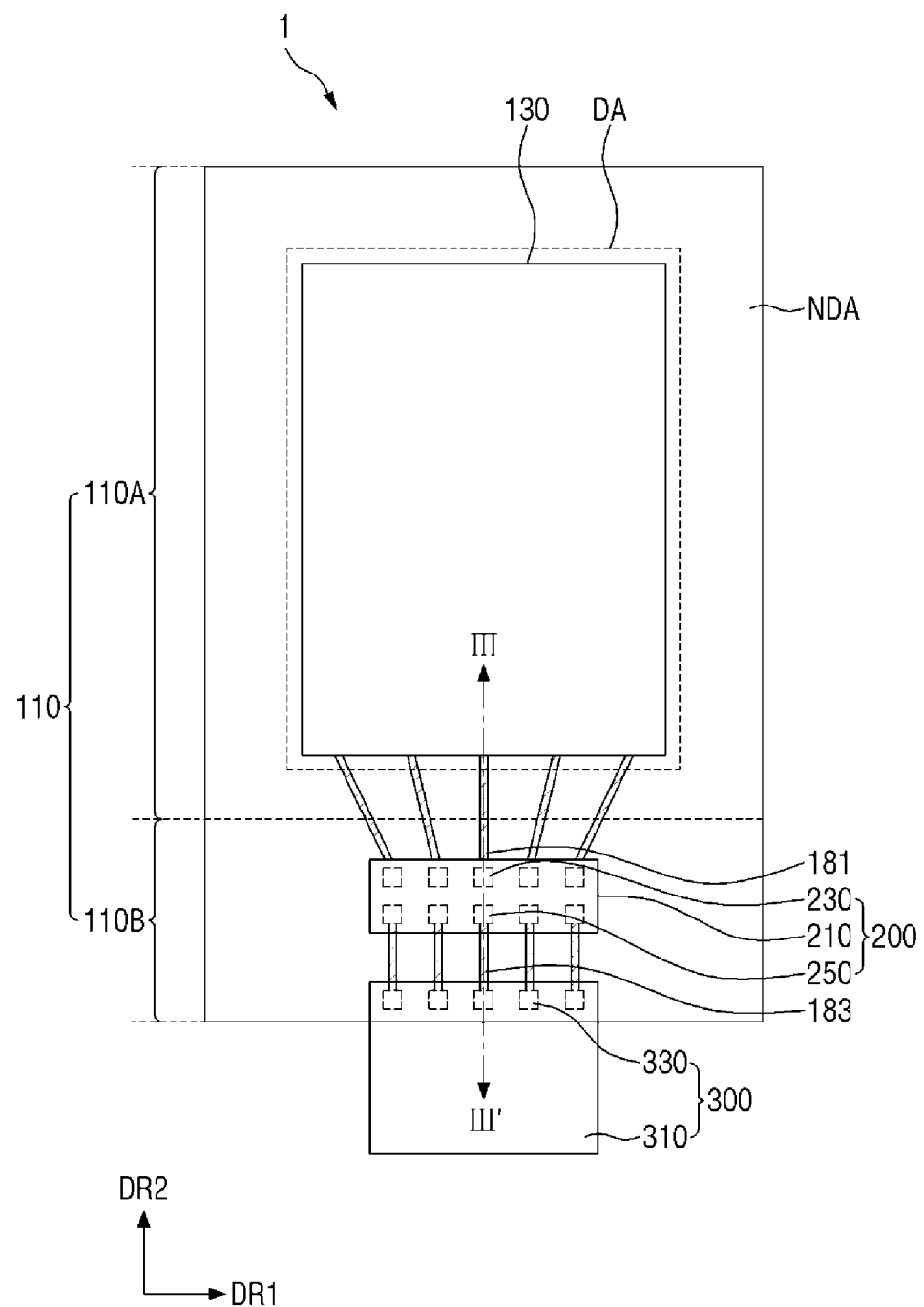
FIG. 1 is a plan view of a display device according to an embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art. Like reference numerals refer to like elements throughout the specification.

The terminology used herein is for the purpose of describing particular embodiments only and is not intended to be limiting of the inventive concept. As used herein, the singular forms "a", "an", and "the" are intended to include plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to", or "coupled to" another element or layer, it can be directly on, connected or coupled to the other element or layer, or one or more intervening elements or layers may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the inventive concept.

Throughout the specification, the same reference numerals are used for the same or similar parts.

Hereinafter, embodiments of the present disclosure will be described with reference to the attached drawings.

Figure 2:
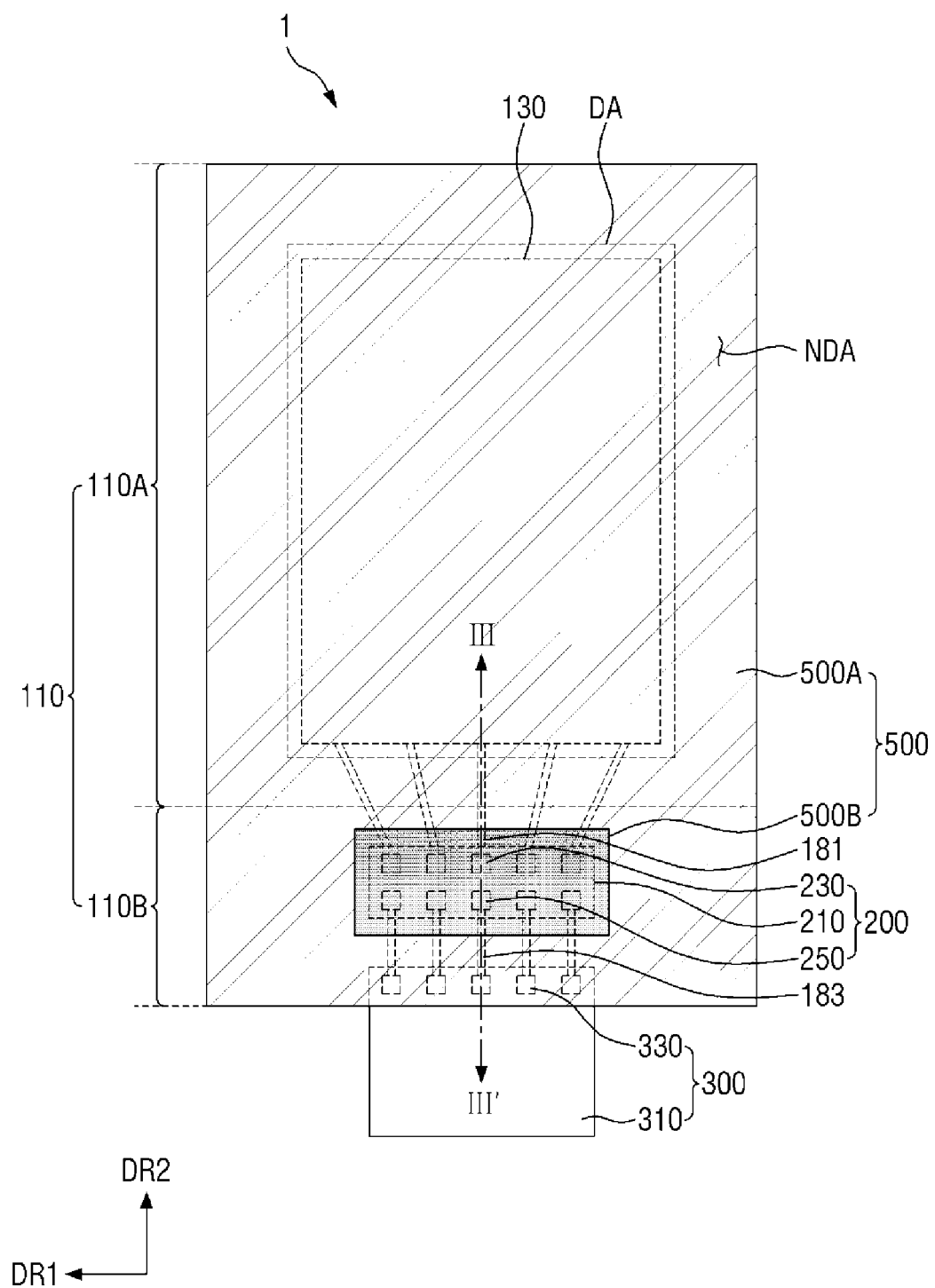
FIG. 2 is a rear view of the display device shown in FIG. 1.
Figure 3:
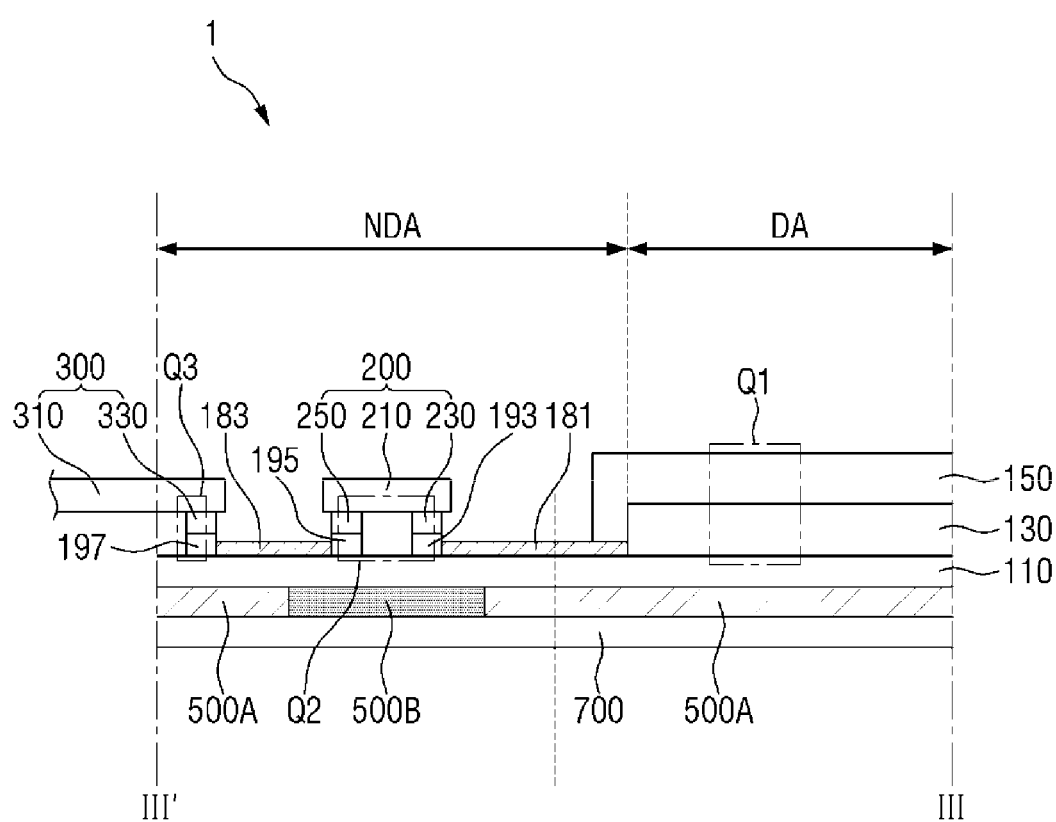
FIG. 3 is a cross-sectional view taken along the line III-III' in FIG. 2.
Figure 4:
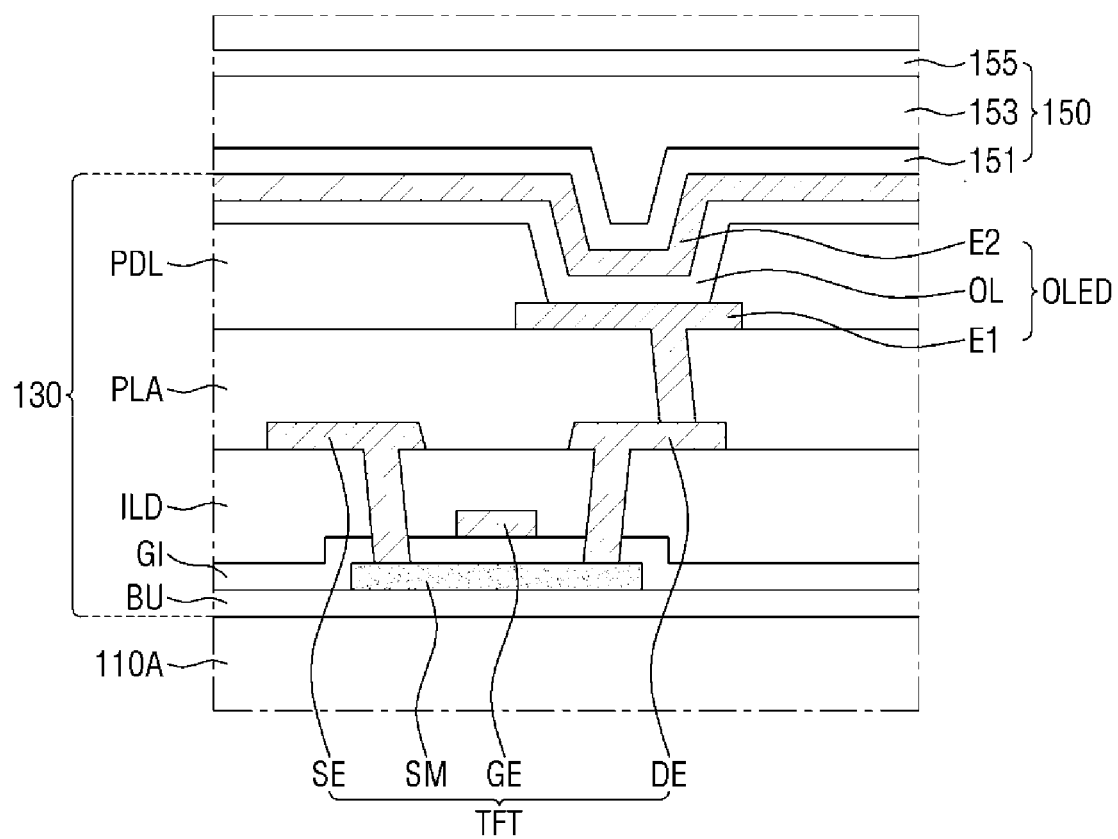
FIG. 4 is an enlarged view of Q1 in FIG. 3.
Figure 5:
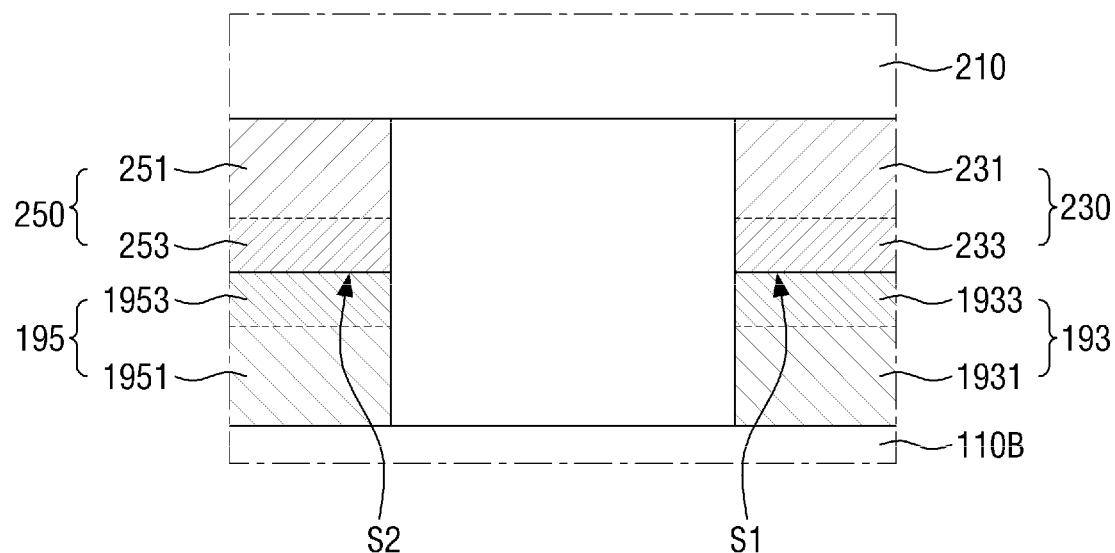
FIG. 5 is an enlarged view of Q2 in FIG. 3.
Figure 6:
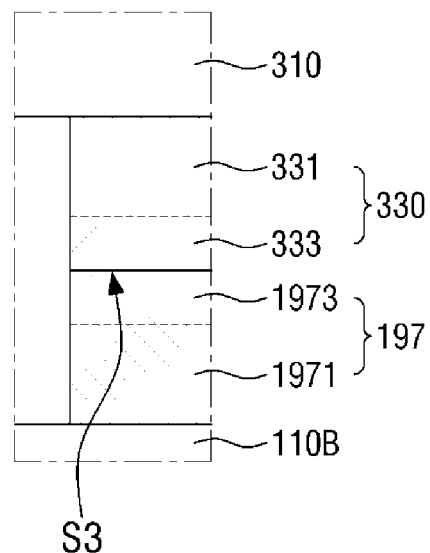
FIG. 6 is an enlarged view of Q3 in FIG. 3.

FIG. 1 is a plan view of a display device according to an embodiment; FIG. 2 is a rear view of the display device shown in FIG. 1; FIG. 3 is a cross-sectional view taken along the line III-III' in FIG. 2; FIG. 4 is an enlarged view of Q1 in FIG. 3; FIG. 5 is an enlarged view of Q2 in FIG. 3; and FIG. 6 is an enlarged view of Q3 in FIG. 3.

Referring to FIGS. 1 to 3, the display device 1 according to this embodiment includes a display area DA and a non-display area NDA around the display area DA. The display area DA is an area where an image is displayed, and the non-display area NDA is an area where an image is not displayed.

The display device 1 may include a flexible base layer 110, a display unit 130, a driving circuit 200, and a support member 700. The display device 1 may further include an adhesive member 500 disposed between the flexible base layer 110 and the support member 700, and may further include a circuit board member 300 and an encapsulation member 150.

The flexible base layer 110 may be an insulating substrate. In an embodiment, the flexible base layer 110 may include a flexible polymer material. Here, the flexible polymer material may be polyimide (PI), polyethersulphone (PES), polyacrylate (PA), polyarylate (PAR), polyetherimide (PEI), polyethylenenapthalate (PEN), polyethyleneterepthalat (PET), polyphenylenesulfide (PPS), polyallylate, polycarbonate (PC), cellulosetriacetate (CAT), cellulose acetate propionate (CAP), or any combination thereof.

The flexible base layer 110 may include a first portion 110A and a second portion 110B. The display area DA in which the display unit 130 is disposed may be defined in the first portion 110A, and a part of the non-display area NDA may be defined in the first portion 11A. Another part of the non-display area NDA may be defined in the second portion 110B, and the driving circuit 200 may be disposed in the second portion 110B. In some embodiments, the first portion 110A and the second portion 110B may be substantially flat. Here, the term "substantially flat" is inclusive of a case of being partially convex or partially concave as well as a case of being fully flat.

The display unit 130 may be located on the first portion 110A of the flexible base layer 110, and the encapsulation member 150 may be located on the display unit 130. In some embodiments, the encapsulation member 150 may encompass the display area DA and the non-display area NDA as shown in FIG. 3.

Referring to FIG. 4, the display unit 130 includes a thin film transistor TFT as a switching element, and a light emitting diode OLED connected to the thin film transistor TFT, and may further include a buffer layer BU, a gate insulating film GI, an interlayer insulating film ILD, a planarization film PLA, a pixel defining film PDL, a gate line (not shown), and a data line (not shown).

The buffer layer BU may be disposed on the first portion 110A of the flexible base layer 110. The buffer layer BU can prevent diffusion of impurity ions and the penetration of moisture or external air, and planarize an underlying surface. The buffer layer BU may include silicon nitride, silicon oxide, or silicon oxynitride. In some embodiments, the buffer layer BU may be omitted depending on process conditions and the like.

A semiconductor layer SM may be disposed on the buffer layer BU. The semiconductor layer SM may include monocrystalline silicon, low-temperature polycrystalline silicon, amorphous silicon, or the like. However, the present disclosure is not limited thereto, and in another embodiment, the semiconductor layer SM may include ITZO (an oxide including indium, tin, and titanium) or IGZO (an oxide including indium, gallium, and tin).

The gate insulating film GI may be disposed on the semiconductor layer SM. The gate insulating film GI may be made of an inorganic material, and may include, for example, silicon oxide, silicon nitride, silicon oxynitride, aluminum oxide, tantalum oxide, hafnium oxide, zirconium oxide, titanium oxide or the like.

A gate electrode GE may be disposed on the gate insulating film GI. The gate electrode GE may be connected to the gate line (not shown) extending along a first direction DR1 to receive a gate signal such as a gate voltage.

The interlayer insulating film ILD may be disposed on the gate electrode GE. The interlayer insulating film ILD may be made of an organic material or an inorganic material, and may be a single-layered film or a multi-layered film including a laminate of different materials.

A source electrode SE and a drain electrode DE may be disposed on the interlayer insulating film ILD. Each of the source electrode SE and the drain electrode DE may penetrate the interlayer insulating film ILD and the gate insulating film GI to be connected to the semiconductor layer SM. The source electrode SE may be connected to a data line extending along a second direction DR2 to receive a data signal such as a data voltage.

The semiconductor layer SM, the gate electrode GE, the source electrode SE, and the drain electrode DE may constitute the thin film transistor TFT.

The planarization film PLA may be disposed on the source electrode SE and the drain electrode DE. In some embodiments, the planarization film PLA may be made of organic material, but the present disclosure is not limited thereto.

A first electrode E1 may be disposed on the planarization film PLA. The first electrode E1 may penetrate the planarization film PLA to be connected to the drain electrode DE. In some embodiments, the first electrode E1 may be an anode electrode.

The pixel defining film PDL partially exposing the first electrode E1 may be disposed on the planarization film PLA. In some embodiments, the pixel defining film PDL may be made of an organic material.

The organic light emitting layer OL may be disposed on the first electrode E1 that is exposed by the pixel defining film PDL. In some embodiments, the organic light emitting layer OL may be made of a low-molecular organic material or a high-molecular organic material such as PEDOT (Poly 3,4-ethylenedioxythiophene). The organic light emitting layer OL may be a multi-layered film including one or more of a hole injection layer HIL, a hole transporting layer HTL, an electron transporting layer ETL, and an electron injection layer EIL.

A second electrode E2 may be disposed on the organic light emitting layer OL and the pixel defining film PDL. In some embodiments, the second electrode E2 may be a cathode electrode to which a common power supply (ELVSS) is supplied.

The first electrode E1, the organic light emitting layer OL, and the second electrode E2 may constitute the light emitting diode OLED.

The encapsulation member 150 may be disposed on the light emitting diode OLED. The encapsulation member 150 can encapsulate the light emitting diode OLED and prevent moisture or the like from penetrating into the light emitting diode OLED from the outside. In some embodiments, the encapsulation member 150 may completely cover the display unit 130.

The encapsulation member 150 may be formed of a thin film encapsulation member, and may include one or more organic films and one or more inorganic films. Illustratively, the encapsulation member 150 may include a first inorganic film 151 disposed on the second electrode E2, an organic film 153 disposed on the first inorganic film 151, and a second inorganic film 155 disposed on the organic film 153.

The first inorganic film 151 can prevent moisture, oxygen, and the like from penetrating into the light emitting diode OLED. The first inorganic film 151 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or the like.

The organic film 153 can improve flatness. The organic film 153 may be formed of an organic material, for example, acrylic resin, methacrylic resin, polyisoprene, vinyl resin, epoxy resin, urethane resin, cellulose resin, or perylene resin.

The second inorganic film 155 may serve a function that is substantially the same as or similar to that of the first inorganic film 151, and may be made of a material substantially the same as or similar to that of the first inorganic film 151. The second inorganic film 155 may completely cover the organic film 153. In some embodiments, the second inorganic film 155 and the first inorganic film 151 may be in contact with each other in the non-display area NDA to form an inorganic-inorganic junction.

The driving circuit 200 may be disposed on the second portion 110B of the flexible base layer 110. The driving circuit 200 may include a driving chip 210, a first terminal 230 connected to the driving chip 210, and a second terminal 250 spaced apart from the first terminal 230 and connected to the driving chip 210.

In some embodiments, the driving chip 210 may be a data driver integrated circuit (IC) providing a data signal or the like for driving the display unit 130.

The first terminal 230 may be an output terminal for outputting a driving signal for driving the display unit 130, and the second terminal 250 may be an input terminal for receiving a control signal and a power supplied from the circuit board member 300. The plurality of first terminals 230 may be provided along the first direction DR1 corresponding to first pads 193, and may be spaced apart from the second terminals 250 along the second direction DR2. The plurality of second terminals 250 may also be provided corresponding to second pads 195 along the first direction DR1.

In some embodiments, each of the first terminal 230 and the second terminal 250 may include a first conductive material. In an exemplary embodiment, the first conductive material may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). In some embodiments, the first terminal 230 and the second terminal 250 may be made of the same material.

The first pad 193 and the second pad 195 may be disposed on the second portion 110B of the flexible base layer 110. In some embodiments, the plurality of first pads 193 may be provided along the first direction DR1, and may be spaced apart from the second pads 195 along the second direction DR2. The plurality of second pads 195 may also be provided along the first direction DR1. The first pad 193 and the second pad 195 may be electrically connected to the driving circuit 200.

A first wiring 181 for electrically connecting the first pad 193 and the display unit 130 may be disposed on the flexible base layer 110. The first wiring 181 may be disposed on the first portion 110A of the flexible base layer 110 as well as on the second portion 110B of the flexible base layer 110.

The circuit board member 300 is connected to an external system and a power supply (not shown). The circuit board member 300 supplies a control signal, a power, and the like to the display unit 130 and the driving circuit 200. The circuit board member 300 is disposed on the second portion 110B of the flexible base layer 110 farther away from the display are DA as compared with the driving circuit 200.

In some embodiments, the circuit board member 300 may include a circuit board 310 and a circuit terminal 330 connected to the circuit board 310.

The circuit board 310 may be a printed circuit board, and may be rigid or flexible. In some embodiments, a part of the circuit board 310 may be rigid, and the other part thereof may be flexible.

The circuit terminal 330 may be made of a conductive material. The circuit terminal 330 may include the same material as the first terminal 230 and the second terminal 250, or may include at least one selected from the exemplified materials constituting the first terminal 230 and the second terminal 250. In some embodiments, a plurality of circuit terminals 330 may be provided, and may be arranged along the first direction DR1.

A circuit pad 197 may be further disposed on the second portion 110B of the flexible base layer 110. The circuit pad 197 may be electrically connected to the circuit board member 300. In some embodiments, the first pad 193 and the second pad 195 may be disposed adjacent to the display area DA as compared with the circuit pad 197. Further, a second wiring 183 for electrically connecting the second pad 195 and the circuit pad 197 may be disposed on the second portion 110B of the flexible base layer 110. In some embodiments, a plurality of circuit pads 197 may be provided along the first direction DR1 according to the circuit terminal 330.

The first pad 193 receives a driving signal output from the driving circuit 200. The driving signal output from the driving circuit 200 may be provided to the display unit 130 through the first pad 193 and the first wiring 181.

The second pad 195 may transmit a control signal and a power provided from the circuit board member 300 to the driving circuit 200, and the circuit pad 197 may receive the control signal and the power provided from the circuit board member 300.

The control signal and the power provided from the circuit board member 300 may be provided to the driving circuit 200 through the circuit pad 197, the second wiring 183, and the second pad 195.

The first pad 193 is electrically connected to the first terminal 230, and the second pad 195 is electrically connected to the second terminal 250.

The first pad 193 and the first terminal 230 may be in direct contact with each other. That is, a separate anisotropic conductive film or the like may not be disposed between the first pad 193 and the first terminal 230. Further, the second pad 195 and the second terminal 250 may be in direct contact with each other, and a separate anisotropic conductive film or the like may not be disposed between the second pad 195 and the second terminal 250.

Accordingly, since a separate anisotropic conductive film is not used, there are advantages of reducing a material cost and reducing connection resistance.

Each of the first pad 193 and the second pad 195 may include a second conductive material. The second conductive material may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), titanium (Ti), tantalum (Ta), tungsten (W), and copper (Cu). Each of the first pad 193 and the second pad 195 may be a single-layered film or a multi-layered film. For example, each of the first pad 193 and the second pad 195 may have a laminate structure of Ti/Al/Ti, Mo/Al/Mo, Mo/AlGe/Mo, Ti/Cu, or the like. In some embodiments, the first pad 193 and the second pad 195 may be made of the same material.

The circuit terminal 330 may include the same material as the first pad 193 and the second pad 195, or may include at least one selected from the exemplified materials constituting the first pad 193 and the second pad 195.

In some embodiments, the first conductive material included in the first terminal 230 and the second terminal 250 may be different form the second conductive material included in the first pad 193 and the second pad 195. For example, when the first terminal 230 and the second terminal 250 include gold (Au) as the first conductive material, the first pad 193 and the second pad 195 may include titanium (Ti) or aluminum (Al) as the second conductive material.

In some embodiments, the first pad 193 and the first terminal 230 may be connected with each other by an ultrasonic bonding method. Ultrasonic bonding is a method of bonding two metals by applying appropriate pressure and ultrasonic vibration.

Referring to FIG. 5, when the first pad 193 and the first terminal 230 are coupled with each other by the ultrasonic bonding method, intermetallic diffusion may occur around a contact interface S1 between the first pad 193 and the first terminal 230 in the bonding process. For example, the first conductive material included in the first terminal 230 may be partially diffused into the first pad 193, and the second conductive material included in the first pad 193 may be partially diffused into the first terminal 230.

The first pad 193 may include a first pad region 1931 and a second pad region 1933. The first pad region 1931 is a portion disposed on the second portion 110B of the flexible base layer 110, including the second conductive material (for example, Ti or Al) and not including the first conductive material (for example, Au). The second pad region 1933 is a portion disposed between the first pad region 1931 and the contact interface S1, including the second conductive material (for example, Ti or Al) and the first conductive material (for example, Au) that is diffused from the first terminal 230 during the bonding process.

Similarly, the first terminal 230 may include a first terminal region 231 and a second terminal region 233. The first terminal region 231 is a portion including the first conductive material (for example, Au) and not including the second conductive material (for example, Ti or Al). The second terminal region 233 is a portion disposed between the first terminal region 231 and the contact interface S1 and including the first conductive material (for example, Au) and the second conductive material (for example, Ti or Al) that is diffused from the first pad 193 during the bonding process.

The second pad 195 and the second terminal 250 may also be coupled with each other by the ultrasonic bonding method. Therefore, the second pad 195 may include a third pad region 1951 including the second conductive material (for example, Ti or Al) and not including the first conductive material (for example, Au), and a fourth pad region 1953 disposed between the third pad region 1951 and a contact interface S2 and including the second conductive material and the first conductive material.

Similarly, the second terminal 250 may include a third terminal region 251 including the first conductive material and not including the second conductive material, and a fourth terminal region 253 disposed between the third terminal region 251 and the contact interface S2 and including the first conductive material and the second conductive material.

In some embodiments, the circuit pad 197 may be electrically connected to the circuit terminal 330 of the circuit board member 300, and the circuit pad 197 and the circuit terminal 330 may be in direct contact with each other. The circuit pad 197 and the circuit terminal 330 may also be coupled with each other by the ultrasonic bonding method.

Referring to FIG. 6, in a case where the circuit pad 197 is made of the same material as the second pad 195, and the circuit terminal 330 is made of the same material as the second terminal 250, the circuit pad 197 may include a first circuit pad region 1971 including the second conductive material and not including the first conductive material, and a second circuit pad region 1973 disposed between the first circuit pad region 1971 and a contact interface S3 and including the second conductive material and the first conductive material. Similarly, the circuit terminal 330 may include a first circuit terminal region 331 including the first conductive material and not including the second conductive material, and a second circuit terminal region 333 disposed between the first circuit terminal region 331 and the contact interface S3 and including the first conductive material and the second conductive material. However, the present disclosure is not limited thereto, and the circuit pad 197 and the circuit terminal 330 may be coupled with each other through an anisotropic conductive film or the like. In some embodiments, the circuit pad 197 and the circuit terminal 330 may be coupled with each other in the form of a connector.

The support member 700 may be disposed beneath the flexible base layer 110. The support member 700, as a component for increasing the strength and/or rigidity of the flexible base layer 110, may be attached to the lower surface of the flexible base layer 110.

In some embodiments, the support member 700 may be formed of a plastic film made of polyethylene naphthalate (PEN), polyethylene terephthalate (PET), other suitable polymers, or any combination of these polymers. The support member 700 may also be formed of a multilayer polymeric stack and/or a synthetic polymer film including a polymeric material combined with nanoparticles or microparticles dispersed therein.

The adhesive member 500 may include a first adhesive member 500A and a second adhesive member 500B. The first adhesive member 500A may be disposed generally on a surface of the support member 700, and the second adhesive member 500B may be disposed to overlap the driving circuit 200. Specifically, the area of the second adhesive member 500B may be larger than the area of the driving circuit 200 on a plane. In some embodiments, as shown in FIG. 3, the first adhesive member 500A and the second adhesive member 500B may be connected to each other.

The second adhesive member 500B may have a higher elastic modulus than the first adhesive member 500A. For example, the elastic modulus of the second adhesive member 500B may be 8 megapascal (MPa) or more. In a case where the elastic modulus of the second adhesive member 500B may be 8 MPa or more, the driving circuit 200 does not absorb ultrasonic vibration when the driving circuit 200 is mounted on the flexible base layer 110 by an ultrasonic bonding method, so that the first terminal 230 and the second terminal 250 of the driving circuit 200 can be stably coupled with the first pad 193 and the second pad 195 of the flexible base layer 110. Further, in a case where the elastic modulus of the first adhesive member 500A is lower than the elastic modulus of the second adhesive member 500B, the flexibility of the flexible base layer 110 can be maintained in the region where the first adhesive member 500A is disposed.

In an embodiment, the first adhesive member 500A and the second adhesive member 500B may be made of different materials from each other. For example, the first adhesive member 500A may be made of a pressure-sensitive adhesive (PSA), and the second adhesive member 500B may be made of a curable adhesive.

In another embodiment, the first adhesive member 500A and the second adhesive member 500B may be made of the same material. For example, both the first adhesive member 500A and the second adhesive member 500B may be made of a curable adhesive. Specifically, the curable adhesive is applied onto the entire surface of the support member 700, and then only a region where the driving circuit 200 is to be disposed is irradiated with light or heat using a light source or a heat source, thereby forming the second adhesive member 500B having a high elastic modulus. Hereinafter, when the first adhesive member 500A and the second adhesive member 500B are made of the same material, a process of coupling the driving circuit 200 with the first pad 193 and the second pad 195 in FIG. 3 will be described with reference to FIGS. 7 to 9.

Figure 7:
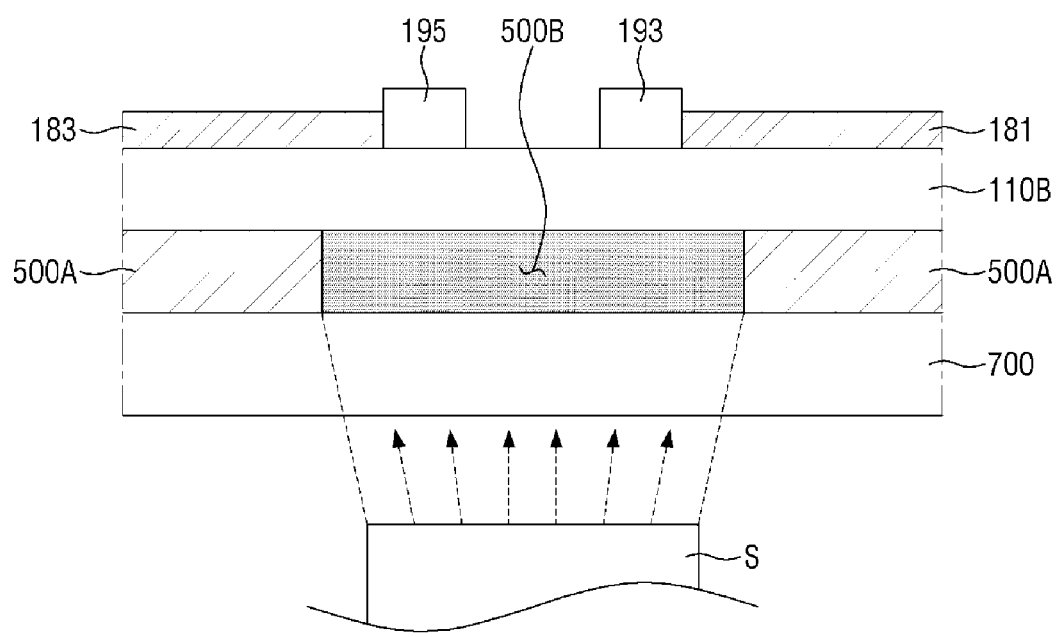
FIGS. 7 to 9 are views for explaining the coupling process between the driving circuit and the first pad and between the driving circuit the second pad in FIG. 3.
Figure 8:
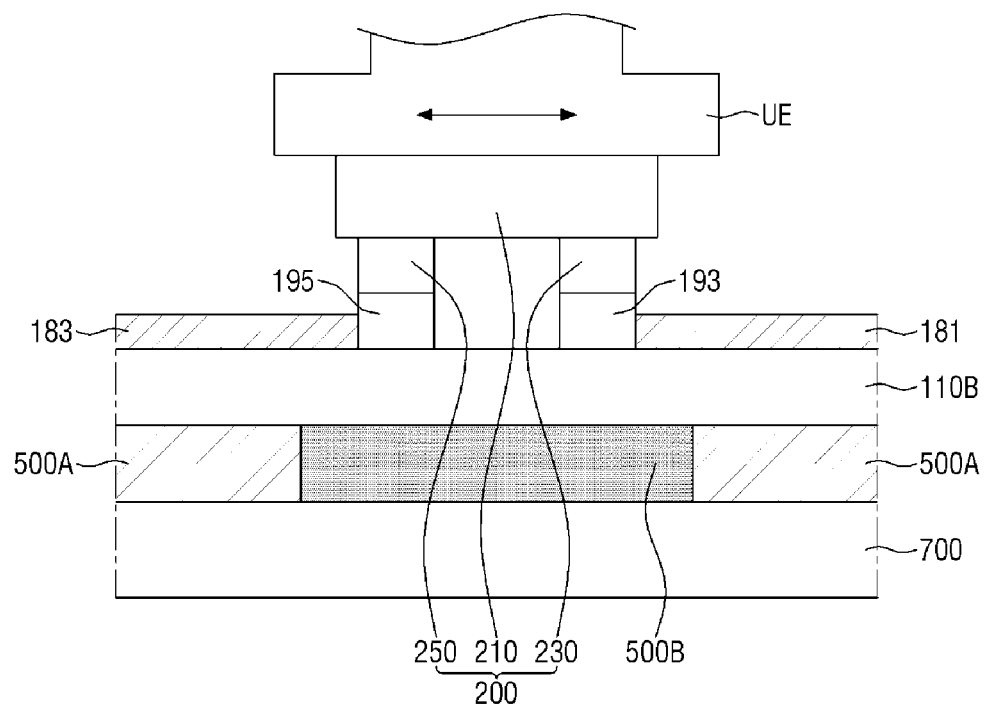
Figure 9:
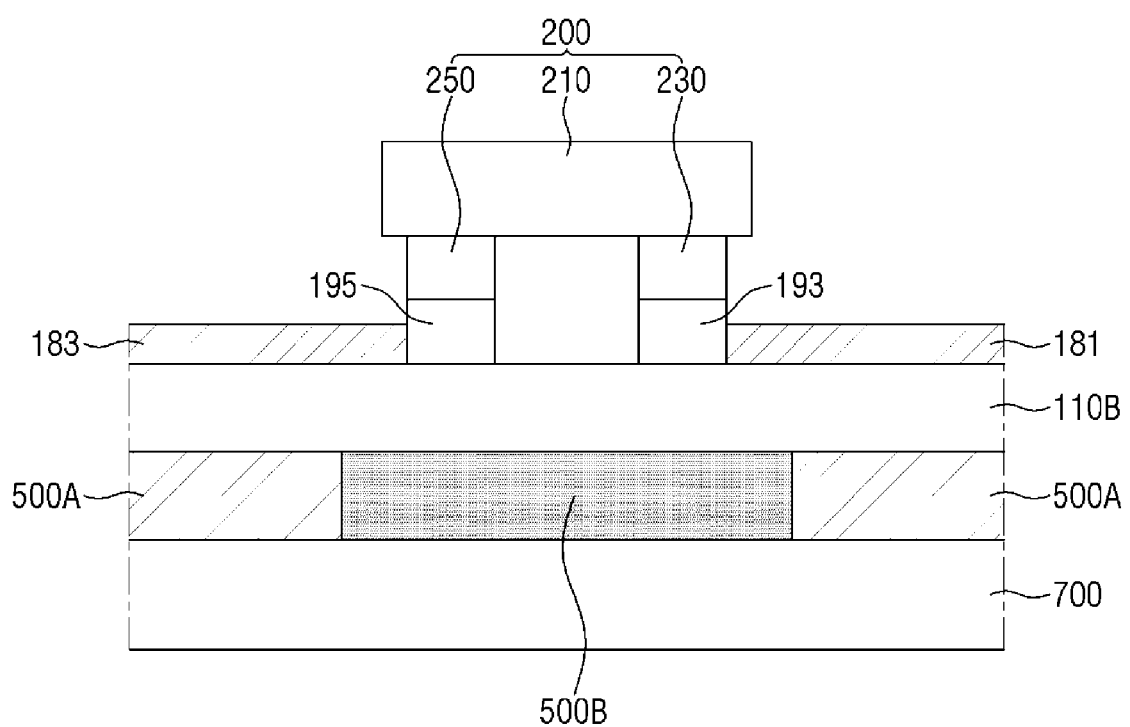

FIGS. 7 to 9 are views for explaining the coupling process between the driving circuit 200 and the first pad 193 and between the driving circuit 200 the second pad 195 in FIG. 3.

Referring to FIGS. 7 to 9, first, as shown in FIG. 7, the adhesive member 500 and the support member 700 are disposed under the flexible base layer 110. In this embodiment, when a curable adhesive is used for the adhesive member 500, the curable adhesive is applied onto the entire surface of the support member 700. Subsequently, heat or light S is applied to a region where the first pad 193 and the second pad 195 are disposed, in other words, a region where the driving circuit 200 is to be disposed, to cure only a part of the adhesive member 500. The cured region of the curable adhesive corresponds to the second adhesive member 500B, and the uncured region thereof corresponds to the first adhesive member 500A.

Next, as shown in FIGS. 8 and 9, the driving circuit 200 is disposed on the second portion 110B. The first terminal 230 of the driving circuit 200 is disposed to be in contact with the first pad 193, and the second terminal 250 of the driving circuit 200 is disposed to be in contact with the second pad 195. Then, pressure is applied from the upper surface of the driving circuit 200 by a head UE, and ultrasonic vibration is applied to the head UE. That is, the driving circuit 200 is mounted on the second portion 110B by an ultrasonic bonding method. Therefore, the first terminal 230 and the first pad 193 are bonded to each other, and the second terminal 250 and the second pad 195 are bonded to each other.

A generally used pressure-sensitive adhesive (PSA) or a curable adhesive before being cured has a low elastic modulus to absorb ultrasonic vibration to a high degree, so that there is a possibility that the junction between the first pad 193 and the driving circuit 200 and the junction between the second pad 195 and the driving circuit 200 are not properly made.

In contrast, a curable adhesive after being cured has a high elastic modulus not to generally absorb ultrasonic vibration, so that the junction reliability between the first pad 193 and the driving circuit 200 and the junction reliability between the second pad 195 and the driving circuit 200 can be improved.

Hereinafter, other embodiments of the present display device will be described. In the following embodiments, a description of the same configuration as that of the previously described embodiment will be omitted or simplified, and differences will be mainly described.

Figure 10:
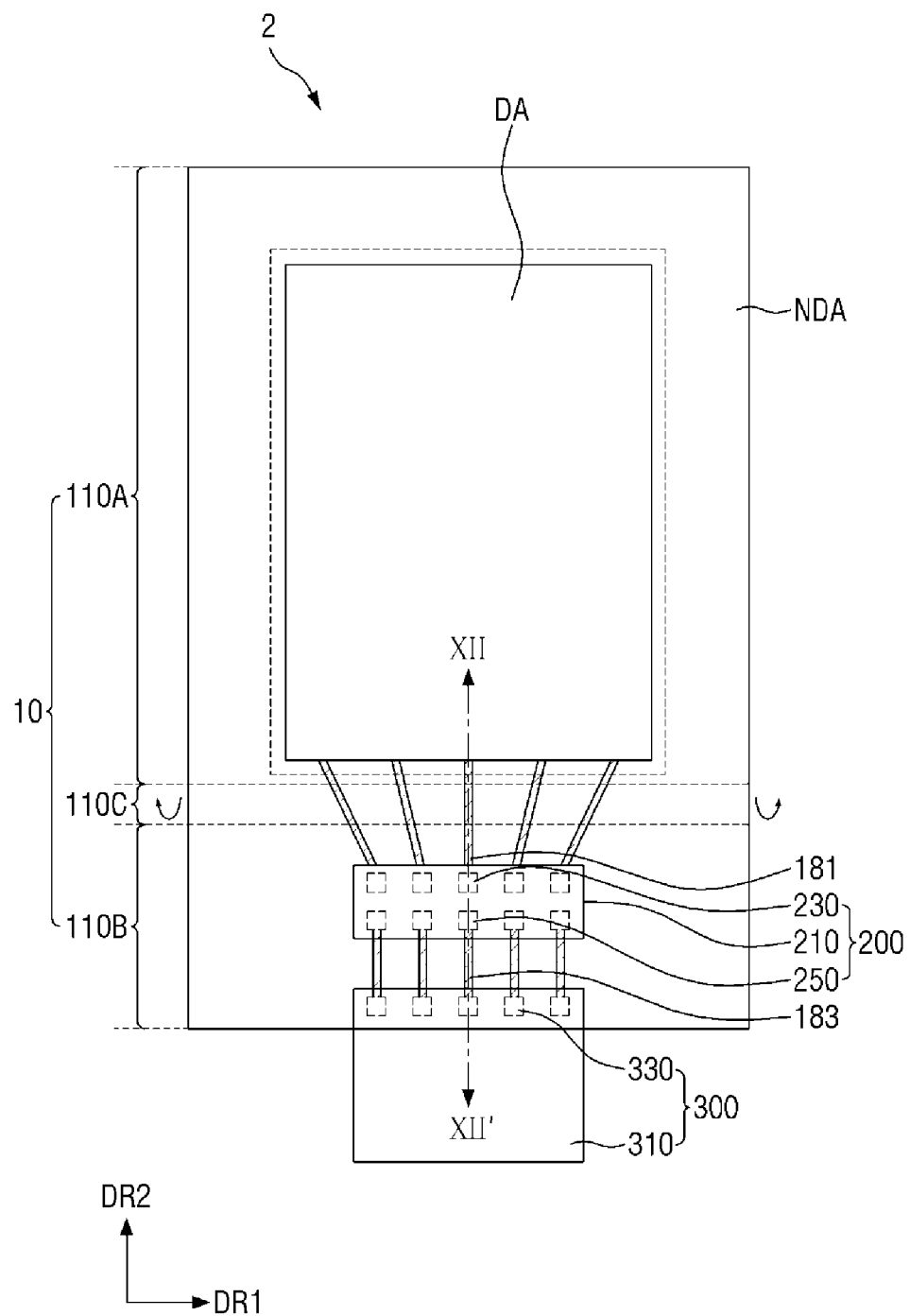
FIG. 10 is a plan view of a display device according to another embodiment, in which a display device in a state before bending is shown.
Figure 11:
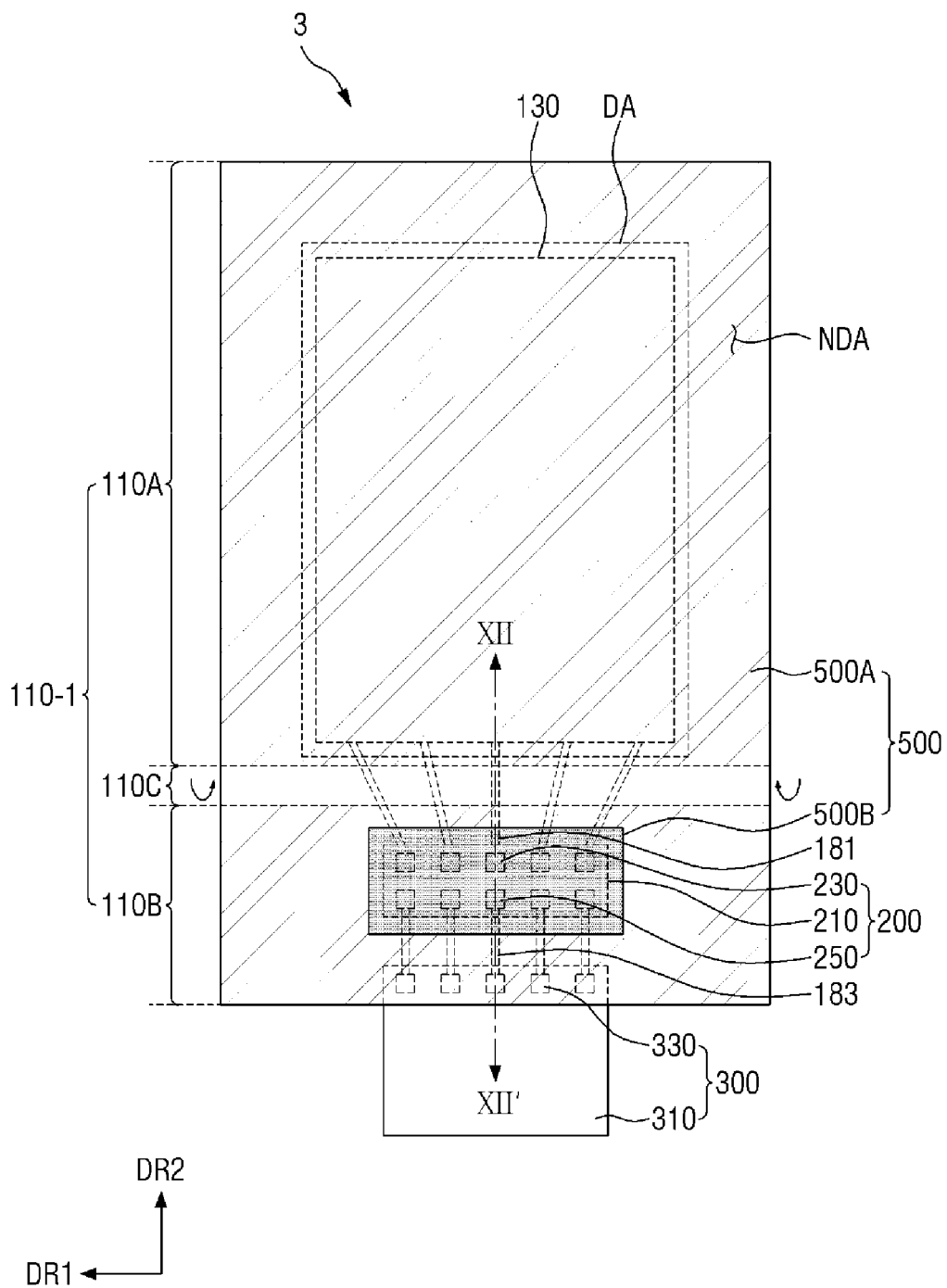
FIG. 11 is a rear view of the display device shown in FIG. 10, in which the display device in a state before bending is shown.
Figure 12:
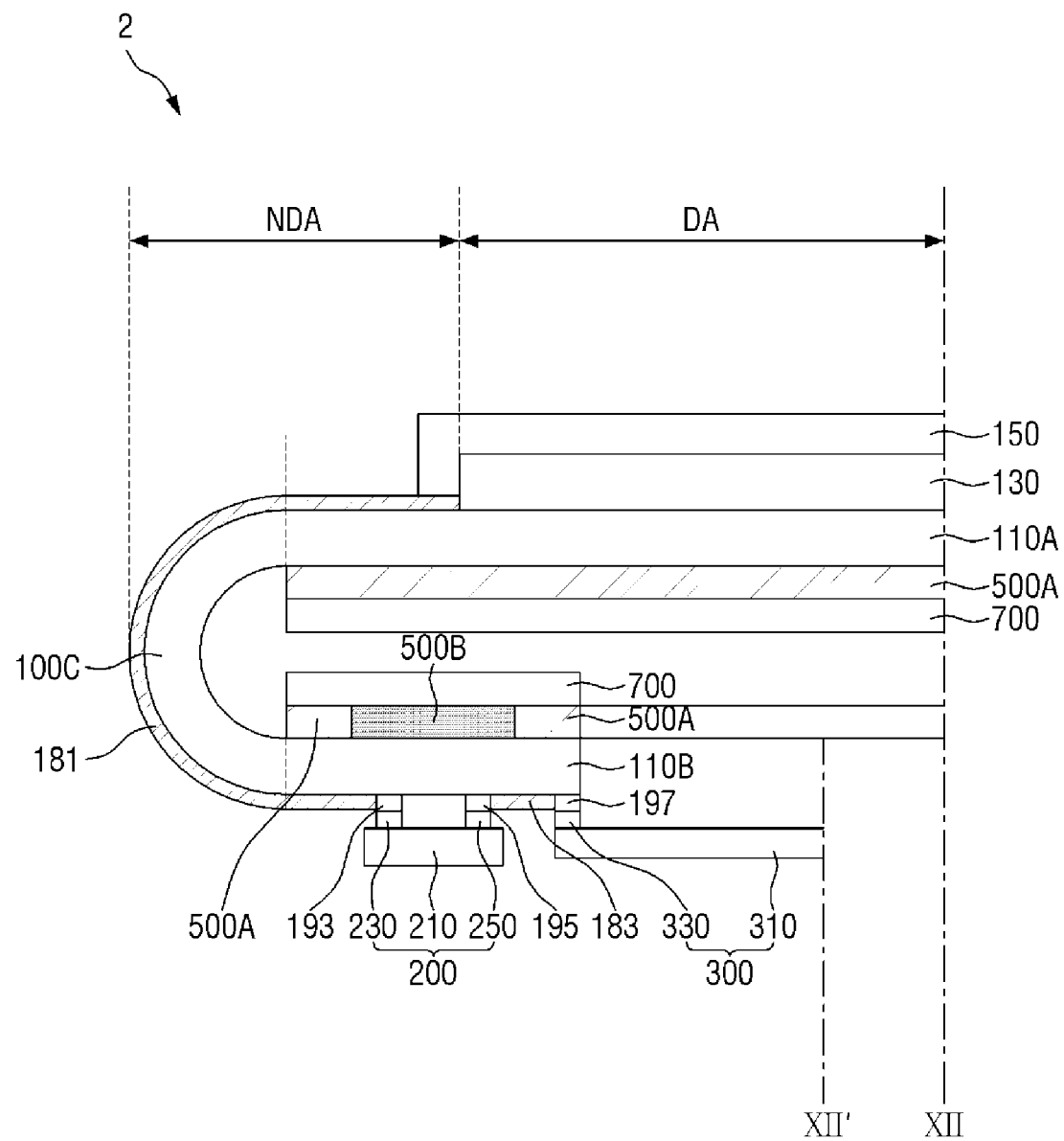
FIG. 12 is a cross-sectional view taken along the line XII-XII' in FIGS. 10 and 11, in which the display device of FIGS. 10 and 11 in a state after bending is shown.

FIG. 10 is a plan view of a display device according to another embodiment, in which a display device in a state before bending is shown. FIG. 11 is a rear view of the display device shown in FIG. 10, in which the display device in a state before bending is shown. FIG. 12 is a cross-sectional view taken along the line XII-XII' in FIGS. 10 and 11, in which the display device of FIGS. 10 and 11 in a state after bending is shown.

Referring to FIGS. 10 to 12, a display device 2 according to this embodiment is different from the display device 1 having been described with reference to FIGS. 1 to 9 in that a flexible base layer 110-1 further include a bending portion 110C.

A flexible base layer 110-1 may further a bending portion 110C between the first portion 110A and the second portion 110B. In the first portion 110A, the display area DA in which the display unit 130 is disposed may be defined, and a part of the non-display area NDA may be defined. In the second portion 110B, another part of the non-display area NDA may be defined, and the driving circuit 200 may be disposed. In the bending portion 110C, another part of the non-display area NDA may be defined, and the first wiring 181 for electrically connecting the display unit 130 and the first pad 193 may be disposed.

The bending portion 110C is a bendable portion. In some embodiments, the bending portion 110C may be bent downward along a virtual bending axis extending in the first direction DR1, and the bending portion 110C may have a predetermined curvature in a bent state. The first portion 110A and the second portion 110B may overlap each other in a state where the bending portion 110C is bent.

The adhesive member 500 and the support member 700 may be disposed beneath the flexible base layer 110-1.

In some embodiments, the adhesive member 500 and the support member 700 may not be disposed on the lower surface of the bending portion 110C. When the adhesive member 500 and the support member 700 are not disposed on the lower surface of the bending portion 110C, the entire thickness of a portion of the display device 2 where the bending is performed becomes thinner. Therefore, the display device 2 can be bent easily by a relatively weaker force, and stress applied to the bent portion in the display device 2 can be reduced.

The second adhesive member 500B is disposed on the second portion 110B and overlaps the driving circuit 200. On the plane, the second adhesive member 500B may be larger than the driving circuit 200. The second adhesive member 500B may be spaced apart from the bending portion 110C by a predetermined distance. If the second adhesive member 500B were disposed on the bending portion 110C, the flexibility of the bending portion 110C would decrease, and thus it would be difficult to bend the bending portion 110C due to a high elastic modulus of the second adhesive member 500B.

Figure 13:
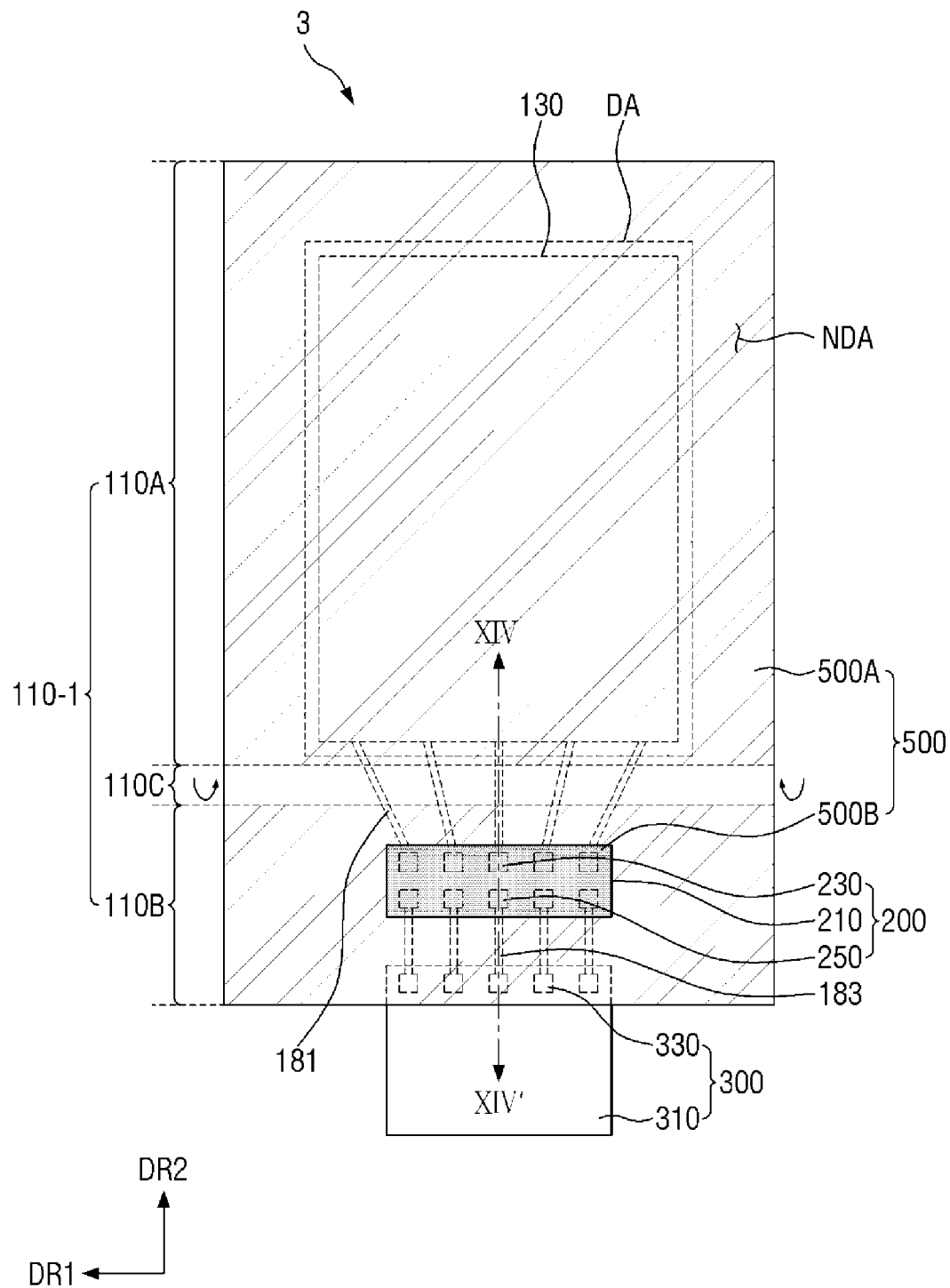
FIG. 13 is a rear view of a display device according to still another embodiment, in which a display device in a state before bending is shown.
Figure 14:
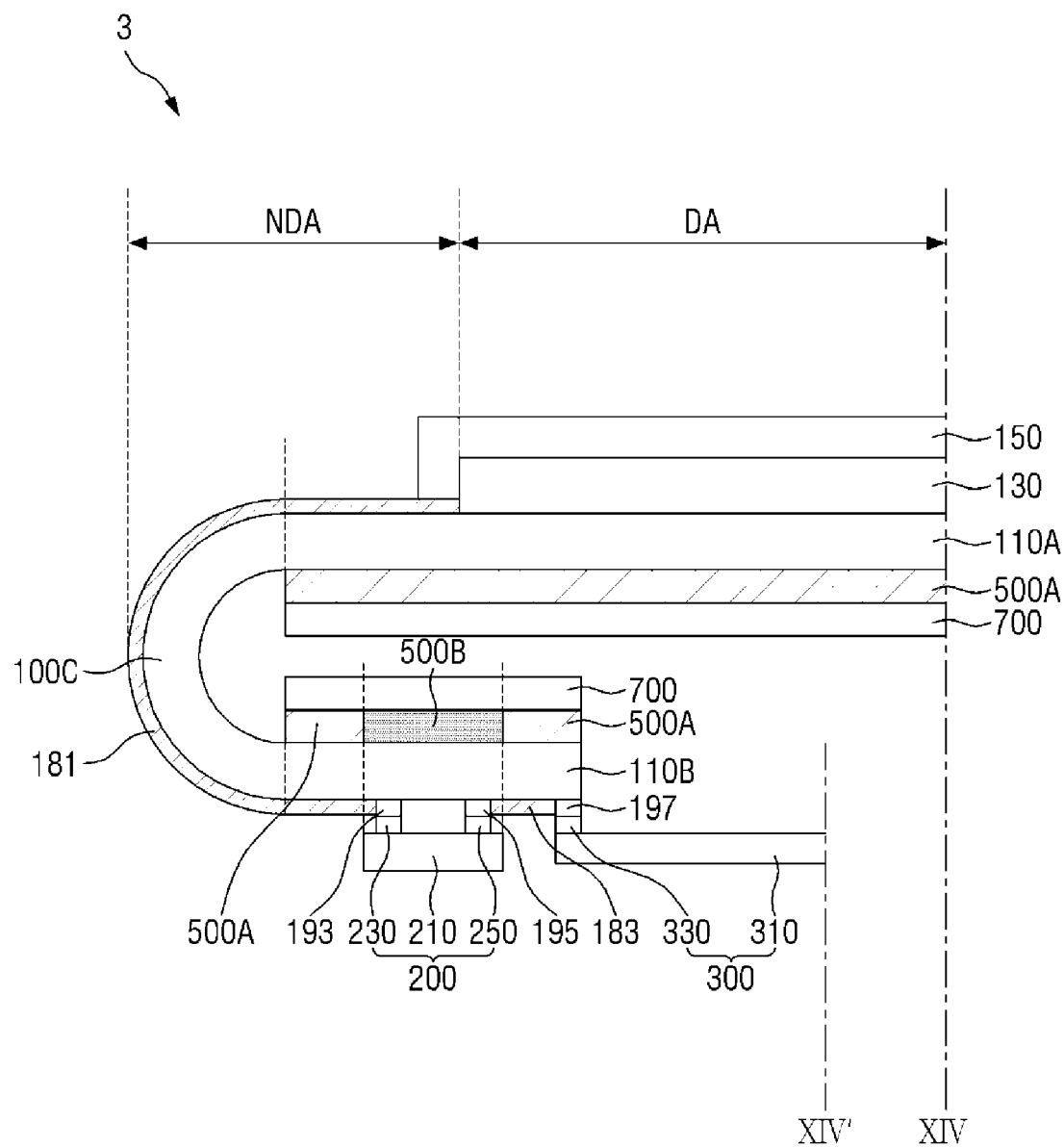
FIG. 14 is a cross-sectional view taken along the line XIV-XIV' in FIG. 13, in which the display device of FIG. 13 in a state after bending is shown.

FIG. 13 is a rear view of a display device according to still another embodiment, in which a display device in a state before bending is shown. FIG. 14 is a cross-sectional view taken along the line XIV-XIV' in FIG. 13, in which the display device of FIG. 13 in a state after bending is shown.

Referring to FIGS. 13 and 14, the area of the second adhesive member 500B of a display device 3 may be substantially the same as the area of the driving circuit 200 on the plane.

The second adhesive member 500B is disposed in a region where the driving circuit 200 is disposed, so that the area occupied by the second adhesive member 500B is reduced while securing the minimum area in which the drive circuit 200 can stably adhere to the second portion 110B, thereby maximizing the flexibility of the flexible base layer 110-1.

Figure 15:
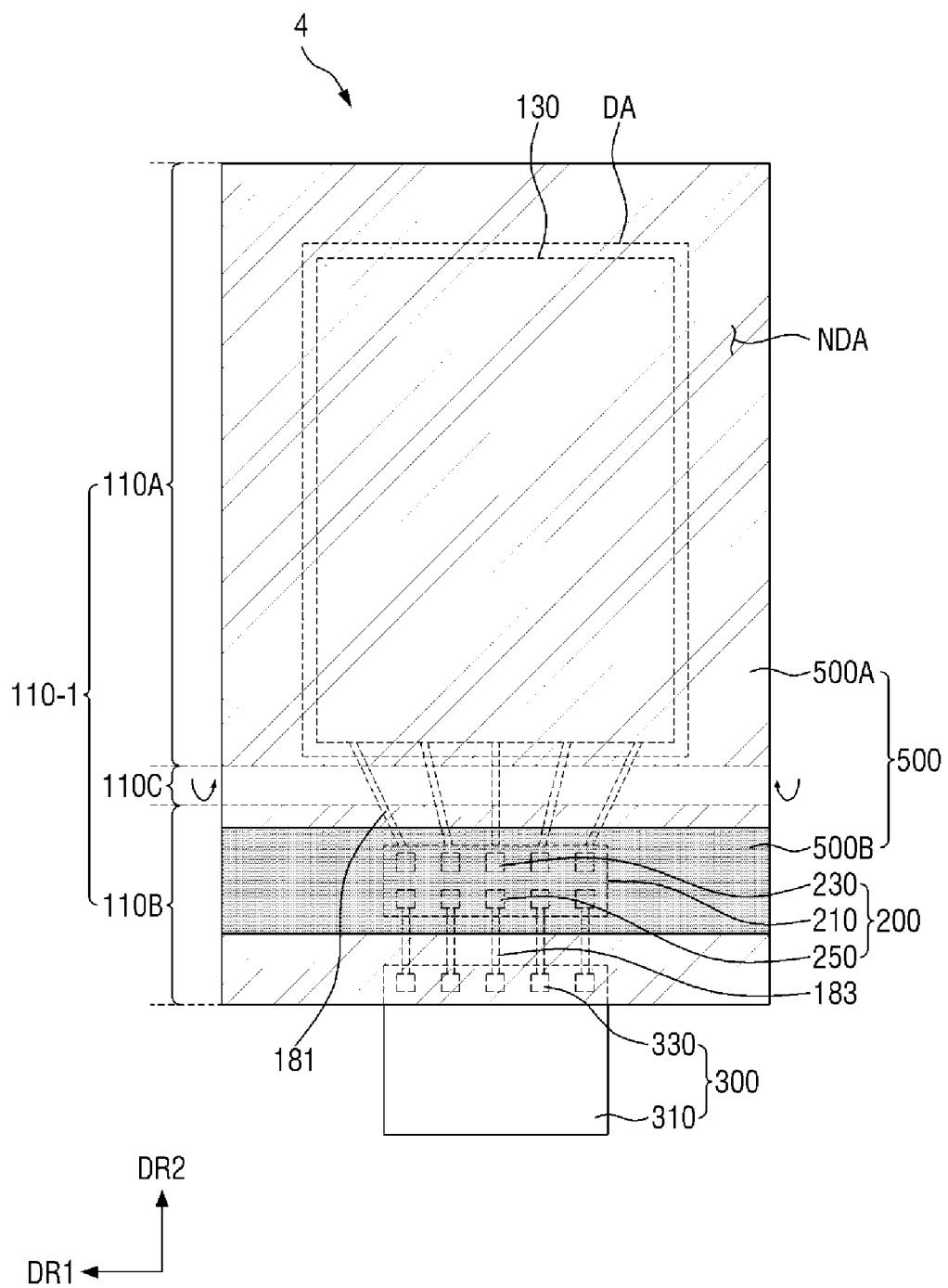
FIGS. 15 and 16 are rear views of display devices according to other embodiments, in each which the display device in a state before bending is shown.
Figure 16:
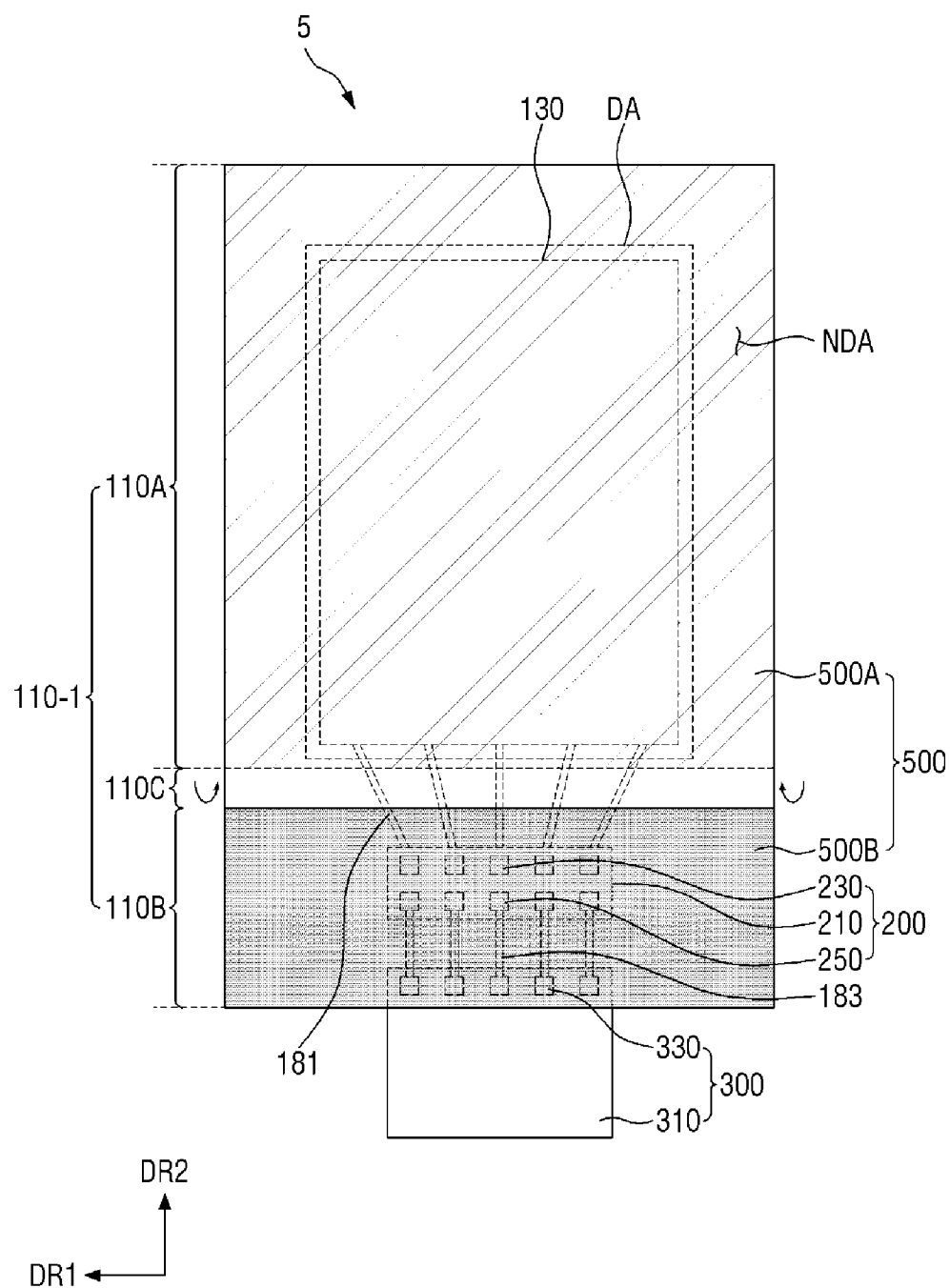

FIGS. 15 and 16 are rear views of display devices according to other embodiments, in each of which the display device in a state before bending is shown.

Referring to FIG. 15, the second adhesive member 500B of a display device 4 may be disposed not only in a region where the drive circuit 200 is disposed but also in a surrounding region of the drive circuit 200 in the second portion 110B. That is, the second adhesive member 500B may be disposed to cross the second portion 110B in the first direction DR1. Both ends of the second adhesive member 500B may be substantially aligned with both ends of the flexible base layer 110-1.

Referring to FIG. 16, the second adhesive member 500B of a display device 5 may be disposed to overlap the entire surface of the second portion 110B.

The edge of the second adhesive member 500B may be substantially aligned with the edge of the flexible base layer 110-1, and the edge of the second adhesive member 500B toward the first adhesive member 500A may be substantially aligned with a boundary between the bending portion 110C and the second portion 110B. That is, the second adhesive member 500B may be disposed not to overlap the bending portion 110C.

The second adhesive member 500B of each of the display devices 4 and 5 of FIGS. 15 and 16 is disposed on a large region or the entire surface of the second portion 110B, thereby making it possible to more firmly support the second portion 110B. In addition, the amount of ultrasonic vibration absorbed at the time of the ultrasonic bonding of the driving circuit 200 is further reduced, so that the bonding reliability of the driving circuit 200 can be further improved.

As described above, according to the embodiments of the present disclosure, there can be provided a display device in which the area of a non-display area is reduced.

Further, according to the embodiments of the present disclosure, there can be provided a display device having improved reliability.

The effects of the present disclosure are not limited by the foregoing, and other various effects are anticipated herein.

Although the preferred embodiments of the present disclosure have been disclosed for illustrative purposes, those skilled in the art will appreciate that various modifications, additions and substitutions are possible, without departing from the scope and spirit of the present disclosure as disclosed in the accompanying claims.

What is claimed is:

1. A display device, comprising:
a base layer including a first portion and a second portion disposed around the second portion;
a display unit disposed on a first surface of the first portion and including a light emitting element;
a driving circuit disposed on a first surface of the second portion and including a driving chip;
a support member attached to a second surface of the first portion and a second surface of the second portion; and
an adhesive member disposed between the base layer and the support member,
wherein the adhesive member includes a first adhesive member having a first elastic modulus and a second adhesive member having a second elastic modulus that is higher than the first elastic modulus, and
wherein the first adhesive member is disposed in the first portion and the second portion of the base layer, and the second adhesive member overlaps the driving circuit in the second portion of the base layer.

2. The display device of claim 1,
wherein the second elastic modulus is 8 megapascal (MPa) or higher.

3. The display device of claim 1,
wherein the second adhesive member has an area equal to or greater than an area of the driving circuit on a plane.

4. The display device of claim 3,
wherein the second adhesive member is disposed on an entire surface of the second portion on a plane.

5. The display device of claim 1, further comprising:
a first pad disposed on the second portion,
wherein the driving circuit includes a first terminal disposed between the driving chip and the first pad and being in direct contact with the first pad.

6. The display device of claim 5,
wherein the second adhesive member overlaps the first pad.

7. The display device of claim 5,
wherein the first terminal includes a first terminal region not including a first conductive material included in the first pad and including a second conductive material that is different from the first conductive material and a second terminal region including the first conductive material and the second conductive material.

8. The display device of claim 5, further comprising:
a second pad disposed on the second portion and spaced apart from the first pad,
wherein the driving circuit further includes a second terminal disposed between the driving chip and the second pad and being in direct contact with the second pad.

9. The display device of claim 8,
wherein the second adhesive member overlaps the first pad and the second pad.

10. The display device of claim 1,
wherein the first adhesive member and the second adhesive member include dissimilar materials.

11. The display device of claim 10,
wherein the first adhesive member is made of a pressure-sensitive adhesive (PSA), and the second adhesive member is a curable adhesive.

12. The display device of claim 1,
wherein the first adhesive member and the second adhesive member are continuously disposed as an integrated adhesive member.

13. The display device of claim 12,
wherein the first adhesive member and the second adhesive member are made of a curable adhesive.

14. A display device, comprising:
a base layer including a first portion, a second portion disposed around the first portion, and a bending portion disposed between the first portion and the second portion;
a display unit disposed on a first surface of the first portion and including a light emitting element;
a driving circuit disposed on a first surface of the second portion and including a driving chip;
a support member disposed on a second surface of the first portion and a second surface of the second portion; and
an adhesive member disposed between the base layer and the support member
wherein the adhesive member includes a first adhesive member having a first elastic modulus and a second adhesive member having a second elastic modulus that is higher than the first elastic modulus, and
wherein the first adhesive member is disposed in the first portion and the second portion of the base layer, and the second adhesive member overlaps the driving circuit in the second portion of the base layer.

15. The display device of claim 14,
wherein the support member and the adhesive member do not overlap the bending portion.

16. The display device of claim 15,
wherein the second adhesive member has an area equal to or greater than an area of the driving circuit on a plane.

17. The display device of claim 16,
wherein the second adhesive member is disposed on an entire surface of the second portion on a plane.

18. The display device of claim 14,
wherein the second elastic modulus is 8 MPa or higher.

19. The display device of claim 14,
wherein the first adhesive member is made of a pressure-sensitive adhesive (PSA), and the second adhesive member is a curable adhesive.

20. The display device of claim 14,
wherein the first adhesive member and the second adhesive member are made of a curable adhesive.

* * * * *